United States Patent
Johnson et al.

(10) Patent No.: US 8,736,061 B2
(45) Date of Patent: May 27, 2014

(54) INTEGRATED CIRCUITS HAVING A CONTINUOUS ACTIVE AREA AND METHODS FOR FABRICATING SAME

(75) Inventors: Frank Johnson, Wappingers Falls, NY (US); Olivier Menut, Saint-Martin-d'Hères (FR); Marc Tarabbia, Pleasant Valley, NY (US); Gregory A. Northrop, Putnam Valley, NY (US)

(73) Assignees: GLOBALFOUNDRIES, Inc., Grand Cayman (KY); International Business Machines, Armonk, NY (US); STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 13/490,840

(22) Filed: Jun. 7, 2012

(65) Prior Publication Data
US 2013/0328205 A1 Dec. 12, 2013

(51) Int. Cl.
*H01L 23/52* (2006.01)
(52) U.S. Cl.
USPC ........... 257/773; 257/201; 257/204; 257/208; 257/E21.573; 257/E23.141
(58) Field of Classification Search
USPC .......................... 257/202–208, 290, 316, 773
See application file for complete search history.

(56) References Cited

U.S. PATENT DOCUMENTS

| | | | |
|---|---|---|---|
| 7,554,152 B1 * | 6/2009 | Ranucci et al. | 257/316 |
| 7,638,851 B2 * | 12/2009 | Hong et al. | 257/390 |
| 8,513,105 B2 * | 8/2013 | Baldwin et al. | 438/587 |
| 2007/0243680 A1 * | 10/2007 | Harari et al. | 438/257 |
| 2008/0210981 A1 * | 9/2008 | Chang et al. | 257/206 |
| 2010/0019280 A1 * | 1/2010 | Becker et al. | 257/208 |
| 2010/0032726 A1 * | 2/2010 | Becker et al. | 257/211 |
| 2010/0214833 A1 * | 8/2010 | Takemura et al. | 365/163 |

\* cited by examiner

*Primary Examiner* — Mamadou Diallo
(74) *Attorney, Agent, or Firm* — Ingrassia Fisher & Lorenz, P.C.

(57) ABSTRACT

Integrated circuits and methods for fabricating integrated circuits are provided. In an embodiment, an integrated circuit includes a standard cell having a first boundary, a second boundary opposite the first boundary, a third boundary interconnecting the first and second boundaries, and a fourth boundary opposite the third boundary and interconnecting the first and second boundaries. The standard cell further includes parallel active areas extending from the first boundary to the second boundary. Also, the standard cell has parallel gate strips extending from the third boundary to the fourth boundary and over the active areas. A cut mask overlies the gate strips. An interconnect is positioned overlying the cut mask and forms an electrical connection with a selected gate strip.

20 Claims, 3 Drawing Sheets

INTEGRATED CIRCUITS HAVING A CONTINUOUS ACTIVE AREA AND METHODS FOR FABRICATING SAME

TECHNICAL FIELD

The present disclosure generally relates to integrated circuits and methods for fabricating integrated circuits, and more particularly relates to integrated circuits having continuous active areas and methods for fabricating integrated circuits with continuous active regions.

BACKGROUND

Conventionally, layouts of semiconductor integrated circuits (ICs) are designed by arranging circuit elements called standard cells. A standard cell has a functional block, such as an AND gate, an OR gate, or a flip-flop, and an internal wiring pattern designed in advance. In large scale integration (LSI) design, standard cells registered in a library are generally aligned in rows and are wired using channels between the rows to realize a desired LSI.

Standard cells include active areas on which many gates are formed. Typically, the last gate formed on the active area (the gate formed nearest the end of the active area formed on the standard cell) exhibits problems. Specifically, the transistor represented by the last gate has performance problems including contact problems, yield problems, and variability problems. These problems arise from the inability to achieve a well-controlled, desirable structure at the end of the active area. For example, under current processing, gates formed at ends of active areas are troubled by undesirable epitaxial growth, facets, undercutting caused by wet etches, and undesirable material left in the topography.

In order to avoid the problems faced by the last gate on an active area, attempts have been made to arrange circuits to avoid having a last gate. However, there is necessarily a last gate somewhere in the design. Other attempts have formed a dummy gate at the end of the active area, with a full active overlap. However, such a design uses a significant amount of area. Another strategy has been to add half of a dummy gate along with an active area tuck under the dummy gate. Again, this method uses a significant amount of area.

In order to avoid the problems associated with the last gate, it is envisioned herein that the active area not be bounded by a standard cell. Rather, each standard cell can be provided with an active area that extends from cell boundary to cell boundary. When arranged, adjacent cells have aligned active areas and form a continuous active area. As a result, last gates are minimized or eliminated.

In order to utilize a continuous active area, gates on each side of the interface between standard cells must be isolated. Specifically, NMOS gates must be tied to ground and the PMOS gates must be tied to the power rail. Yet conventional tying methods, such as vias, result in use of a significant amount of IC area, leading to the design problems associated with the dummy gate methods noted above.

Accordingly, it is desirable to provide integrated circuits and methods for fabricating integrated circuits having continuous active areas. In addition, it is desirable to provide integrated circuits and methods for fabricating integrated circuits which provide for electrical connection between gate strips and interconnects without taking up additional IC space. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In accordance with one embodiment, an integrated circuit includes a standard cell having a first boundary, a second boundary opposite the first boundary, a third boundary interconnecting the first and second boundaries, and a fourth boundary opposite the third boundary and interconnecting the first and second boundaries. The standard cell further includes parallel active areas extending from the first boundary to the second boundary. Also, the standard cell has parallel gate strips extending from the third boundary to the fourth boundary and over the active areas. A cut mask overlies the gate strips. An interconnect is positioned overlying the cut mask and forms an electrical connection with a selected gate strip.

In another embodiment, an integrated circuit is provided and includes an array of standard cells. Each standard cell includes a first boundary, a second boundary opposite the first boundary, a third boundary interconnecting the first and second boundaries, and a fourth boundary opposite the third boundary and interconnecting the first and second boundaries. Further, each standard cell has an active area extending from the first boundary to the second boundary. Also, each standard cell is provided with a gate strip extending from the third boundary to the fourth boundary and over the active area. A cut mask overlying terminal portions of the gate strip is provided. The integrated circuit includes interconnects positioned along interfaces formed between the third boundaries and fourth boundaries of adjacent cells and overlying the respective cut masks. The interconnects form electrical connections with selected gate strips.

In accordance with another embodiment, a method for fabricating an integrated circuit includes providing a plurality of standard cells. Each standard cell has a first boundary, a second boundary parallel to the first boundary, a third boundary interconnecting the first boundary and the second boundary, and a fourth boundary parallel to the third boundary. In the method, parallel active areas extending across each standard cell from the first boundary to the second boundary are formed. The method also forms parallel gate strips extending across each standard cell from the third boundary to the fourth boundary and over the active areas. A cut mask is deposited on each standard cell overlying the gate strips. Openings are formed in selected cut masks. A first interconnect portion is deposited across each standard cell from the first boundary to the second boundary and overlying the third boundary. Further, a second rail portion is deposited across each standard cell from the first boundary to the second boundary and overlying the fourth boundary. Selected interconnect portions include extensions aligned with the openings to provide electrical connection between the selected interconnect portions and selected gate strips.

BRIEF DESCRIPTION OF THE DRAWINGS

Embodiments of the integrated circuits having continuous active areas and methods for fabricating integrated circuits having continuous active areas will hereinafter be described in conjunction with the following drawing figures, wherein like numerals denote like elements, and wherein.

DETAILED DESCRIPTION

The following detailed description is merely exemplary in nature and is not intended to limit the integrated circuits or the methods for fabricating integrated circuits as claimed herein. Furthermore, there is no intention to be bound by any expressed or implied theory presented in the preceding technical field, background or brief summary, or in the following detailed description.

It is contemplated herein that continuous active areas can be utilized in integrated circuits to avoid or minimize the presence of last gates (i.e., gates otherwise bounded by insulating material at the end of an active area). In order to provide continuous active areas, the integrated circuits herein isolate gates formed adjacent interfaces between adjacent standard cells by tying them to ground or power rails. Further, the integrated circuits herein avoid the use of vias or wires that consume IC space to connect the gates to the ground or power rails. Instead, it is envisioned herein that the interconnects forming the ground or power rails be selectively deposited directly onto interface-adjacent gates, thereby avoiding the use of additional IC space.

Figure 1:
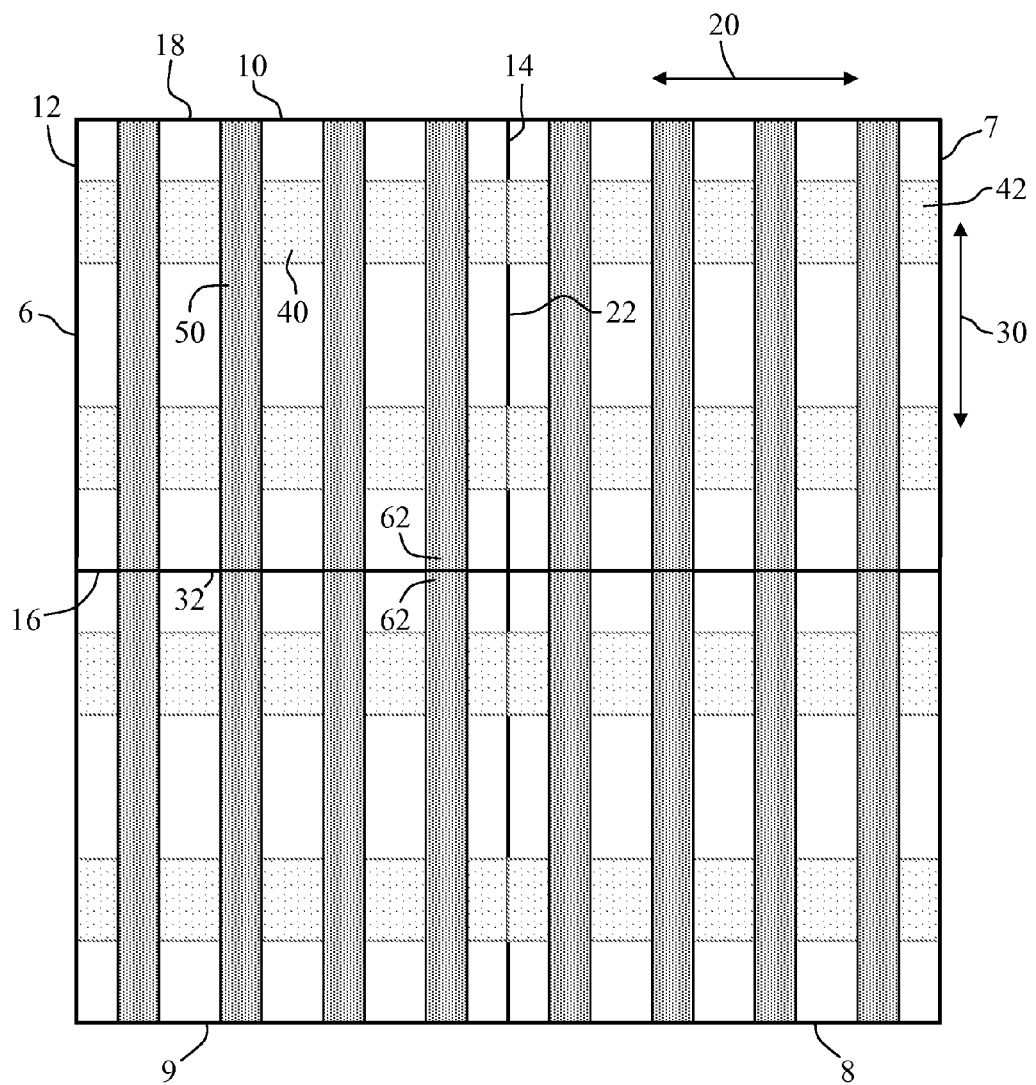
FIG. 1 illustrates a layout of a standard cell array, wherein the standard cells are shown with active areas and gate strips in accordance with various embodiments herein.
Figure 2:
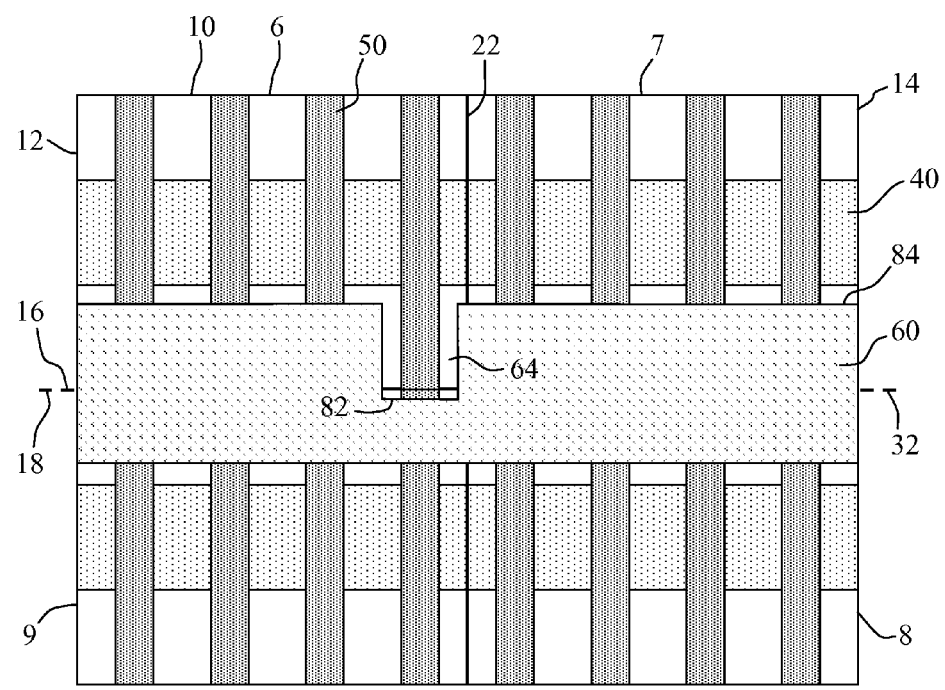
FIG. 2 illustrates a layout of the standard cell array of FIG. 1, focusing on the interfaces between the cells, and includes a cut mask in accordance with various embodiments herein
Figure 3:
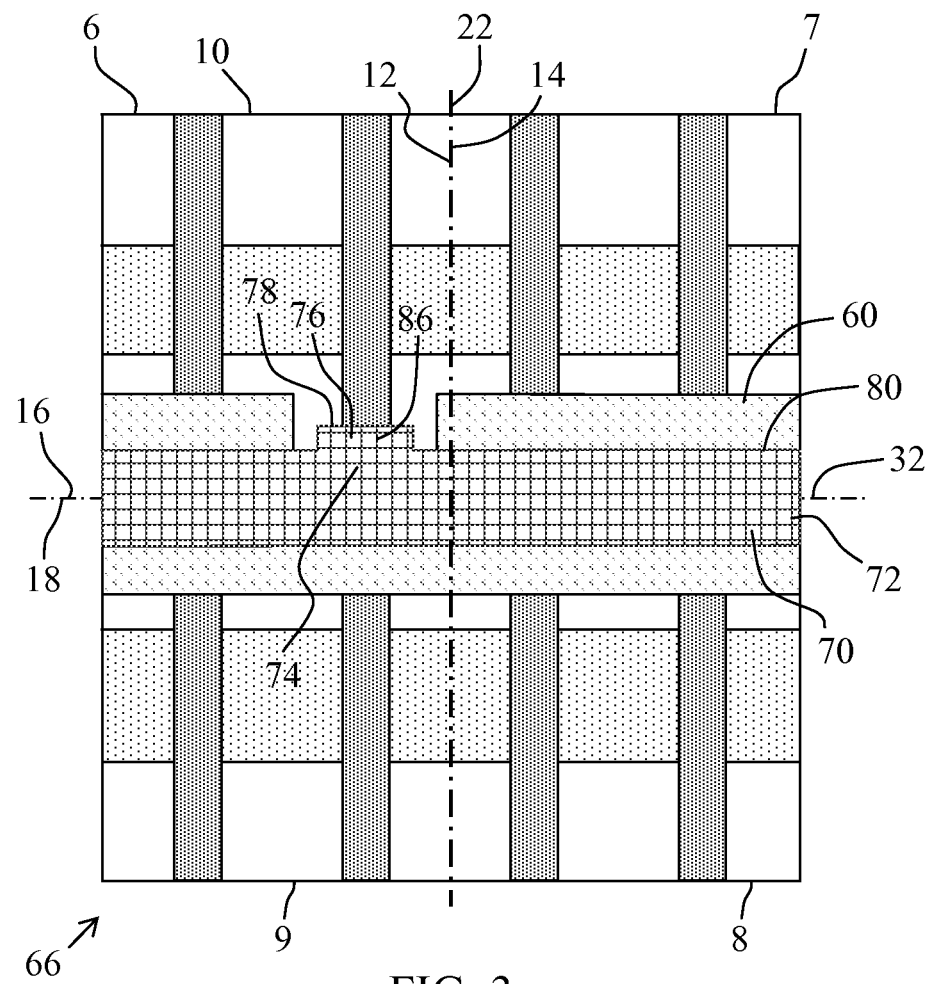
FIG. 3 illustrates the layout of FIG. 2 further including an interconnect to illustrate the electrical connection between the interconnect and the selected gate strip in accordance with various embodiments herein.

In accordance with the various embodiments herein, integrated circuits having continuous active areas and methods for fabricating integrated circuits having continuous active areas are provided. FIGS. 1-3 illustrate sequentially the layers forming such integrated circuits in accordance with various embodiments herein. Various steps in the design and composition of integrated circuits are well known and so, in the interest of brevity, many conventional steps will only be mentioned briefly herein or will be omitted entirely without providing the well known process details. Further, it is noted that standard cells may include a varying number of components and that single components shown in the illustrations may be representative of multiple components.

Turning now to FIG. 1, in an exemplary embodiment, the process of fabricating an integrated circuit begins by providing a plurality of standard cells 10. In FIG. 1, individual standard cells are identified as 6, 7, 8, and 9. As shown, each standard cell 10 has a first boundary 12, a second boundary 14 opposite and parallel to the first boundary 12, a third boundary 16 interconnecting the first boundary 12 and the second boundary 14, and a fourth boundary 18 opposite and parallel to the third boundary 16. Standard cells 10 adjacent in the direction 20 (e.g., standard cells 6 and 7) form interfaces 22 at the respective first boundaries 12 and second boundaries 14. Standard cells 10 adjacent in the direction 30 (e.g., standard cells 6 and 9) form interfaces 32 at the respective third boundaries 16 and fourth boundaries 18.

Parallel active areas 40 are formed on the standard cells 10 and extend across each standard cell 10 from the first boundary 12 to the second boundary 14. As a result, when placed adjacent to a standard cell 10 in the direction 20, continuous active areas 42 are formed. In other words, the active areas 40 are not bounded within the standard cells 10, but instead connect and continue across horizontally-arranged standard cells 10. In FIG. 1, parallel gate strips 50 are also formed on the standard cells 10. The gate strips 50 extend across each standard cell 10 from the third boundary 16 to the fourth boundary 18. Further, the gate strips 50 extend over the active areas to form transistors.

In FIG. 2, which focuses on the interfaces 22 and 32, a cut mask 60 is deposited over the terminal gates or portions 62 (identified in FIG. 1) of the gates strips 50 adjacent the interface 32 at the third boundary 16 of standard cells 6 and 7 and the fourth boundary 18 of standard cells 8 and 9. The cut mask 60 is formed from an insulating material and extends over the respective third boundary 16 and fourth boundary 18 from the respective first boundary 12 to the respective second boundary 14. The cut mask 60 cuts the continuity of the gate strips 50 between cells 6 and 9, and between cells 7 and 8. In the integrated circuit fabrication method, an opening 64 is selectively formed in cut masks 60.

FIG. 3, further focused on the interfaces 22 and 32 of FIG. 2, shows the integrated circuit 66 formed after depositing an interconnect 70 such as a ground or power rail. Specifically, selected interconnects 70 are connected to a power supply (not shown) that is employed, at least in part, in driving devices on the integrated circuit 66, such as by providing a power supply voltage or potential. Thus, the interconnect 70 may be a VDD interconnect. Other selected interconnects 70 are connected to VSS (not shown) and may be ground interconnects.

During standard cell 10 design, a portion such as half 72 of the interconnect 70 is assigned to each standard cell 10 at the respective third boundaries 16 and fourth boundaries 18. Therefore, while not shown in the FIGS., it is understood that cut masks 60 and interconnects 70 are provided at each third boundary 16 and fourth boundary 18. Each interconnect 70 is deposited over a respective cut mask 60 and extends from the respective first boundary 12 to the respective second boundary 14. Further, selected interconnect portions 74 are provided with extensions 76 aligned with the openings 64 to provide electrical connection between the selected interconnects 70 and selected gate strips 50. As shown, the extensions 76 extend in the direction 30 (identified in FIG. 1) to form extended edges 78 distanced from the non-extended edges 80. Referring back to FIG. 2, it is noted that the cut masks 60 define opening edges 82 and body edges 84.

In an exemplary embodiment for a 20 nanometer (nm) semiconductor design, the electrical connection between the interconnect 70 and the gate strip 50 has a contact area 86 with a width (in the direction 20 of FIG. 1) equal to a width of the gate strip 50 and a length (in the direction 30 of FIG. 1) of about 30 nm to about 40 nm, such as about 36 nm, i.e., the interconnect 70 (including extension 76) overlaps the gate strip 50 through the opening 64 by about 36 nm. Further, in the exemplary embodiment, the extended edge 78 of the interconnect 70 is distanced from the nearest active area 40 by about 20 nm to about 30 nm, such as by about 27 nm, and the non-extended edge 80 of the interconnect 70 is distanced from the nearest active area 40 by about 40 nm to about 50 nm, such as about 46 nm. Further, in the exemplary embodiment, the opening edge 82 of the cut mask 60 is distanced from the nearest active area 40 by about 60 nm to about 70 nm, such as by about 63 nm and the body edge 84 of the cut mask 60 is distanced from the nearest active area 40 by about 15 nm to about 25 nm, such as about 18 nm.

As a result of the design of the standard cells 10 herein, the terminal gates 62 in the gate strips 50 are isolated by selective tying to an interconnect 70 that is connected to the appropriate ground or a power supply. Further, the gates 62 are isolated by direct connection to the interconnect 70, without requiring the use of vias or wires that would take up IC space.

To briefly summarize, the fabrication methods described herein result in integrated circuits having continuous active areas 42. As a result, gates adjacent the end of active areas, and their attendant problems, are minimized or eliminated. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An integrated circuit comprising a standard cell having a first boundary, a second boundary opposite the first boundary, a third boundary interconnecting the first and second boundaries, and a fourth boundary opposite the third boundary and interconnecting the first and second boundaries; the standard cell including:
   parallel active areas extending from the first boundary to the second boundary;
   parallel gate strips extending from the third boundary to the fourth boundary and over the active areas;
   a cut mask overlying the gate strips;
   an interconnect positioned overlying the cut mask, the interconnect forming an electrical connection with a selected gate strip.

2. The integrated circuit of claim 1 wherein the selected gate strip includes a last gate adjacent the third boundary, and wherein the electrical connection ties the last gate to the interconnect.

3. The integrated circuit of claim 1 wherein the interconnect is in direct electrical connection with the selected gate strip.

4. The integrated circuit of claim 1 wherein the cut mask is formed with an opening over the selected gate strip, and wherein the electrical connection between the interconnect and the selected gate strip is formed through the opening.

5. The integrated circuit of claim 4 wherein the interconnect is formed with an extension aligned with the opening in the cut mask, and wherein the extension is in electrical connection with the selected gate strip.

6. The integrated circuit of claim 5 wherein the cut mask overlies the gate strips at and adjacent the third boundary of the standard cell, and wherein the interconnect is positioned above the third boundary of the standard cell.

7. The integrated circuit of claim 6 further comprising a second standard cell adjacent the third boundary of the standard cell, and wherein the cut mask and the interconnect are centered over the third boundary.

8. The integrated circuit of claim 7 wherein the selected gate strip and the interconnect form a contact area having a width equal to a width of the selected gate strip and a length of about 30 nm to about 40 nm.

9. The integrated circuit of claim 8 wherein the interconnect includes an extended edge and a non-extended edge, and wherein the extended edge is distanced from a nearest active area by about 20 nm to about 30 nm and the non-extended edge is distanced from the nearest active area by about 40 nm to about 50 nm.

10. The integrated circuit of claim 9 wherein the cut mask includes an opening edge and a body edge, and wherein the opening edge is distanced from the nearest active area by about 60 nm to about 70 nm and the body edge is distance from the nearest active area by about 15 nm to about 25 nm.

11. An integrated circuit comprising an array of standard cells, wherein each standard cell comprises:
    a first boundary, a second boundary opposite the first boundary, a third boundary interconnecting the first and second boundaries, and a fourth boundary opposite the third boundary and interconnecting the first and second boundaries;
    an active area extending from the first boundary to the second boundary;
    a gate strip extending from the third boundary to the fourth boundary and over the active area; and
    a cut mask overlying terminal portions of the gate strip; and
    wherein the integrated circuit further comprises interconnects positioned along interfaces formed between the third boundaries and fourth boundaries of adjacent cells and overlying the respective cut masks, wherein the interconnects form electrical connections with selected gate strips.

12. The integrated circuit of claim 11 wherein each selected gate strip includes a last gate adjacent a selected boundary and wherein the electrical connection ties the last gate to a respective interconnect.

13. The integrated circuit of claim 11 wherein the respective interconnects are in direct electrical connection with the selected gate strips.

14. The integrated circuit of claim 11 wherein the cut mask of each standard cell is formed with an opening over the terminal portions of the gate strip, and wherein the electrical connection between the respective interconnect and the selected gate strip is formed through the opening.

15. The integrated circuit of claim 14 wherein the interconnect is formed with an extension aligned with the opening in the cut mask, and wherein the extension is in electrical connection with the selected gate strip.

16. The integrated circuit of claim 15 wherein the cut mask overlies the gate strips at and adjacent the interfaces.

17. The integrated circuit of claim 16 wherein each cut mask and each interconnect are centered over the interfaces.

18. The integrated circuit of claim 15 wherein each electrical connection has a contact area with a width equal to a width of the selected gate strip and a length of about 36 nm.

19. The integrated circuit of claim 8 wherein each interconnect includes an extended edge and a non-extended edge and each cut mask includes an opening edge and a body edge, wherein the extended edge is distanced from a nearest active area by about 20 nm to about 30 nm and the non-extended edge is distanced from the nearest active area by about 40 nm to about 50 nm, and wherein the opening edge is distanced from the nearest active area by about 60 nm to about 70 nm and the body edge is distance from the nearest active area by about 18 nm.

20. A method for fabricating an integrated circuit comprising:
    providing a plurality of standard cells, wherein each standard cell has a first boundary, a second boundary parallel to the first boundary, a third boundary interconnecting the first boundary and the second boundary, and a fourth boundary parallel to the third boundary;

forming parallel active areas extending across each standard cell from the first boundary to the second boundary;

forming parallel gate strips extending across each standard cell from the third boundary to the fourth boundary and over the active areas;

depositing a cut mask on each standard cell overlying the gate strips;

forming openings in selected cut masks;

depositing a first interconnect portion across each standard cell from the first boundary to the second boundary and overlying the third boundary;

depositing a second interconnect portion across each standard cell from the first boundary to the second boundary and overlying the fourth boundary; and wherein selected interconnect portions include extensions aligned with the openings to provide electrical connection between the selected interconnect portions and selected gate strips.

* * * * *